(12) United States Patent
Kasama (10) Patent No.: US 7,588,150 B2
(45) Date of Patent: Sep. 15, 2009

(54) WAFER CONTAINER WITH CUSHION SHEETS

(75) Inventor: Nobuyuki Kasama, Tokyo (JP)

(73) Assignee: Miraial Co., Ltd., Tokyo (JP)

( * ) Notice: Subject to any disclaimer, the term of this patent is extended or adjusted under 35 U.S.C. 154(b) by 0 days.

(21) Appl. No.: 12/281,491

(22) PCT Filed: Jul. 24, 2007

(86) PCT No.: PCT/JP2007/064473
§ 371 (c)(1),
(2), (4) Date: Sep. 3, 2008

(87) PCT Pub. No.: WO2008/013153
PCT Pub. Date: Jan. 31, 2008

(65) Prior Publication Data
US 2009/0050518 A1    Feb. 26, 2009

(30) Foreign Application Priority Data
Jul. 25, 2006    (JP)    ............................... 2006-201390

(51) Int. Cl.
*B65D 85/30*    (2006.01)
(52) U.S. Cl. .................. 206/710; 206/303; 206/454; 206/509
(58) Field of Classification Search .................. 206/303, 206/454, 710–712, 722, 723, 724, 521, 591, 206/594, 509, 511, 524.8, 832; 211/41.18
See application file for complete search history.

(56) References Cited

U.S. PATENT DOCUMENTS

| | | | | |
|---|---|---|---|---|
| 4,778,326 A | * | 10/1988 | Althouse et al. | ............ 206/710 |
| 4,848,542 A | * | 7/1989 | Burnette et al. | ............. 206/454 |
| 5,211,717 A | * | 5/1993 | Skoura | ........................ 206/710 |
| 6,837,374 B2 | * | 1/2005 | Nigg et al. | .................... 206/454 |
| 2002/0144927 A1 | * | 10/2002 | Brooks et al. | ............... 206/710 |

FOREIGN PATENT DOCUMENTS

| | | |
|---|---|---|
| JP | 10-50815 | 2/1998 |
| JP | 2003-168731 | 6/2003 |
| JP | 2005-191419 | 7/2005 |

(Continued)

OTHER PUBLICATIONS

English language Abstract of JP 10-50815, Feb. 20, 1998.

(Continued)

*Primary Examiner*—Luan K Bui
(74) *Attorney, Agent, or Firm*—Greenblum & Bernstein, P.L.C.

(57) ABSTRACT

A wafer-retaining cushion sheet (5) has a wafer suction-adhering surface (5C) formed on a surface thereof, which adheres by suction to a semiconductor wafer (W). A wafer tray (1) is provided with a plurality of bottom openings (17) opening to the reverse side of the wafer-retaining cushion sheet (5), an air chamber (16) communicating with the bottom openings, and an air inlet (11) for supplying pressurized air into the air chamber (16) from the outside. Consequently, when pressurized air is supplied into the air chamber (16) through the air inlet (11) to increase the air pressure in the air chamber (16), the wafer-retaining cushion sheet (5) is elastically deformed into an inflated form at regions facing the bottom openings (17), thus causing separation between the semiconductor wafer (W) and at least a part of the wafer suction-adhering surface (5C) of the wafer-retaining cushion sheet (5).

18 Claims, 11 Drawing Sheets

FOREIGN PATENT DOCUMENTS

JP    2005-286114    10/2005

OTHER PUBLICATIONS

English language Abstract of JP 2005-286114, Oct. 13, 2005.
English language Abstract of JP 2003-168731, Jun. 13, 2003.
English language Abstract of JP 2005-191419, Jul. 14, 2005.
U.S. Appl. No. 12/293,329 to Kasama, which was filed on Sep. 17, 2008.

* cited by examiner

WAFER CONTAINER WITH CUSHION SHEETS

TECHNICAL FIELD

The present invention relates to a wafer container with cushion sheets (hereinafter occasionally referred to as "cushioned wafer container") for use to transport or store semiconductor wafers.

BACKGROUND ART

In a semiconductor manufacturing process, thin semiconductor wafers are carried or accommodated in a wafer container when transported between processing steps or moved or stored in each individual processing step to prevent the semiconductor wafers from being damaged or contaminated.

There has been proposed a wafer container having a plurality of wafer trays superimposed over each other to accommodate each individual semiconductor wafer in an interior space formed between a pair of adjacent wafer trays so that semiconductor wafers can be safely accommodated therein independently of each other (for example, see Patent Document 1).

To safely accommodate semiconductor wafers, which have become fragile as the result of being extremely reduced in thickness in recent years, a wafer container with cushion sheets has been proposed in which a single semiconductor wafer is held between two cushion sheets in an interior space formed between two wafer trays. By being held between the cushion sheets, the semiconductor wafer is prevented from being damaged by an external force such as vibration or impact (for example, see Patent Document 2).

Patent Document 1: Japanese Patent Application Publication No. 2003-168731
Patent Document 2: Japanese Patent Application Publication No. 2005-191419

DISCLOSURE OF THE INVENTION

Problem to be Solved by the Invention:

A semiconductor wafer is flat when it is held between two cushion sheets in between two mutually superimposed wafer trays. However, when the upper and lower wafer trays are separated from each other to release the semiconductor wafer from the state of being held between the cushion sheets, the semiconductor wafer that has been flat may be warped by internal stress present therein, for example. If such a change of state is repeated many times, the semiconductor wafer may be damaged.

Under these circumstances, it is conceivable to stick the semiconductor wafer to the lower cushion sheet so that the semiconductor wafer is always kept flat. An extremely thin semiconductor wafer, however, may be damaged by the force of adhesion to the cushion sheet when it is separated therefrom.

An object of the present invention is to provide a wafer container with cushion sheets capable of preventing damage to semiconductor wafers during transport or storage and capable of keeping the semiconductor wafers flat at all times to prevent damage to the wafers due to repeated change of state (between the state of being flat and the state of being warped).

Means for Solving the Problem:

To attain the above-described object, the present invention provides a cushioned wafer container including a plurality of mutually superimposed wafer trays each for retaining a semiconductor wafer, and an elastic wafer-retaining cushion sheet attached to the top of each wafer tray to place the semiconductor wafer thereon. The semiconductor wafer placed on the surface of the wafer-retaining cushion sheet is accommodated in an interior space formed between each wafer tray and another wafer tray that is adjacently superimposed thereover. The wafer container further includes a wafer suction-adhering surface formed on the surface of the wafer-retaining cushion sheet. The wafer suction-adhering surface adheres by suction to the semiconductor wafer. Each wafer tray is provided with a plurality of bottom openings opening to the reverse side of the wafer-retaining cushion sheet, an air chamber communicating with the bottom openings, and an air inlet for supplying pressurized air into the air chamber from the outside. When pressurized air is supplied into the air chamber through the air inlet to increase the air pressure in the air chamber, the wafer-retaining cushion sheet is elastically deformed into an upwardly inflated form at regions facing the bottom openings, thus causing separation between the semiconductor wafer and at least a part of the wafer suction-adhering surface of the wafer-retaining cushion sheet.

It should be noted that the cushioned wafer container may be arranged as follows. The wafer suction-adhering surface of the wafer-retaining cushion sheet is formed by a multiplicity of minute suction cups, so that pressing the minute suction cups against the semiconductor wafer causes the semiconductor wafer to be secured by suction to the minute suction cups.

The cushioned wafer container may be arranged as follows. The wafer-retaining cushion sheet has a size sufficiently large to retain substantially the whole surface of the semiconductor wafer, and the wafer suction-adhering surface is formed on at least a part of the obverse side of the wafer-retaining cushion sheet.

The wafer suction-adhering surface may be formed only at positions of the wafer-retaining cushion sheet that are coincident with the bottom openings formed in each wafer tray. Alternatively, the wafer suction-adhering surface may be formed only at positions of the wafer-retaining cushion sheet that are not coincident with the bottom openings formed in each wafer tray.

The wafer suction-adhering surface may be distributed on the wafer-retaining cushion sheet at a uniform density or at locally different densities. In this case, the remaining part of the obverse side of the wafer-retaining cushion sheet other than the wafer suction-adhering surface may be recessed from the wafer suction-adhering surface.

In addition, a tray suction-adhering surface that airtightly adheres by suction to the top of the wafer tray may be formed on the reverse side of the wafer-retaining cushion sheet. Regarding the respective adhesive forces of the wafer suction-adhering surface and tray suction-adhering surface of the wafer-retaining cushion sheet, the adhesive force of the wafer suction-adhering surface relative to the semiconductor wafer is preferably set smaller than the adhesive force of the tray suction-adhering surface relative to the top of the wafer tray.

The wafer-retaining cushion sheet may comprise an integrated stack of a tray suction-adhering layer having the tray suction-adhering surface, a cushion layer functioning as an elastic cushion, and a wafer suction-adhering layer having the wafer suction-adhering surface. In this case, the cushion layer may be formed of an elastomeric polymer material or an elastic foamed polymer material.

The bottom openings may be evenly distributed throughout a region facing the reverse side of the wafer-retaining cushion sheet. The bottom openings formed in the wafer tray may each have a groove shape extending radially outward from the center thereof.

The cushioned wafer container may further include an elastic wafer-pressing cushion sheet disposed on the bottom of each wafer tray to press the semiconductor wafer against the wafer-retaining cushion sheet. In this case, at least one of the wafer-retaining cushion sheet and the wafer-pressing cushion sheet preferably has a surface electrical resistance in the range of from $10^8 \Omega$ to $10^{10} \Omega$. The cushioned wafer container may further include a tray connecting mechanism for releasably connecting together the superimposed wafer trays into a stack such that the stack of superimposed wafer trays can be disconnected at any desired position in the stack.

The cushioned wafer container according to the present invention may be arranged as follows. The cushioned wafer container includes a plurality of mutually superimposed wafer trays each for retaining a semiconductor wafer, and an elastic wafer-retaining cushion sheet attached to the top of each wafer tray to place the semiconductor wafer thereon. The semiconductor wafer placed on the surface of the wafer-retaining cushion sheet is accommodated in an interior space formed between each wafer tray and another wafer tray that is adjacently superimposed thereover. The wafer container further includes a wafer suction-adhering surface formed on the surface of the wafer-retaining cushion sheet. The wafer suction-adhering surface adheres by suction to the semiconductor wafer. Each wafer tray is provided with a plurality of bottom openings opening to the reverse side of the wafer-retaining cushion sheet, an air chamber communicating with the bottom openings, and a suction port for externally sucking out air from the air chamber. When the air in the air chamber is externally sucked out through the suction port to reduce the air pressure in the air chamber, the wafer-retaining cushion sheet is elastically deformed in the state of being sucked toward the bottom openings at regions thereof facing the bottom openings, thus causing separation between the semiconductor wafer and at least a part of the wafer suction-adhering surface of the wafer-retaining cushion sheet. In this case, the wafer suction-adhering surface is preferably formed only at positions of the wafer-retaining cushion sheet that are coincident with the bottom openings formed in each of the wafer trays.

Advantageous Effects of the Invention:

According to the present invention, a wafer suction-adhering surface that adheres by suction to a semiconductor wafer is formed on the surface of the wafer-retaining cushion sheet, whereby the semiconductor wafer can be always kept secured by suction to the surface of the wafer-retaining cushion sheet. Consequently, there is no likelihood of the semiconductor wafer being damaged during transport. In addition, the semiconductor wafer can be kept flat at all times and hence prevented from being damaged by repeated change of state (between the state of being flat and the state of being warped).

Further, the wafer-retaining cushion sheet having the semiconductor wafer held by suction to the surface thereof is inflated at a plurality portions by pressurized air (or sucked at a plurality of portions) from the reverse side thereof to thereby cause separation between the semiconductor wafer and at least a part of the wafer suction-adhering surface of the wafer-retaining cushion sheet. Therefore, the semiconductor wafer can be readily separated from the wafer-retaining cushion sheet without damage.

EXPLANATION OF REFERENCE NUMERALS

1: wafer tray
5: retaining cushion (wafer-retaining cushion sheet)
5A: cushion layer
5B: tray suction-adhering layer
5C: wafer suction-adhering layer
8: connecting hole (tray connecting mechanism)
9: connecting hook (tray connecting mechanism)
11: air inlet
11': suction port
13: top
14: bottom
15: pressing cushion (wafer pressing cushion sheet)
15A: cushion layer 15B: suction-adhering layer
16: air chamber
17: bottom opening
20: pressurizing pump
30: suction pump
50: wafer suction-adhering surface
51: non-adhering surface
W: semiconductor wafer

BEST MODE FOR CARRYING OUT THE INVENTION

Embodiments of the present invention will be explained below with reference to the accompanying drawings.

Figure 2:
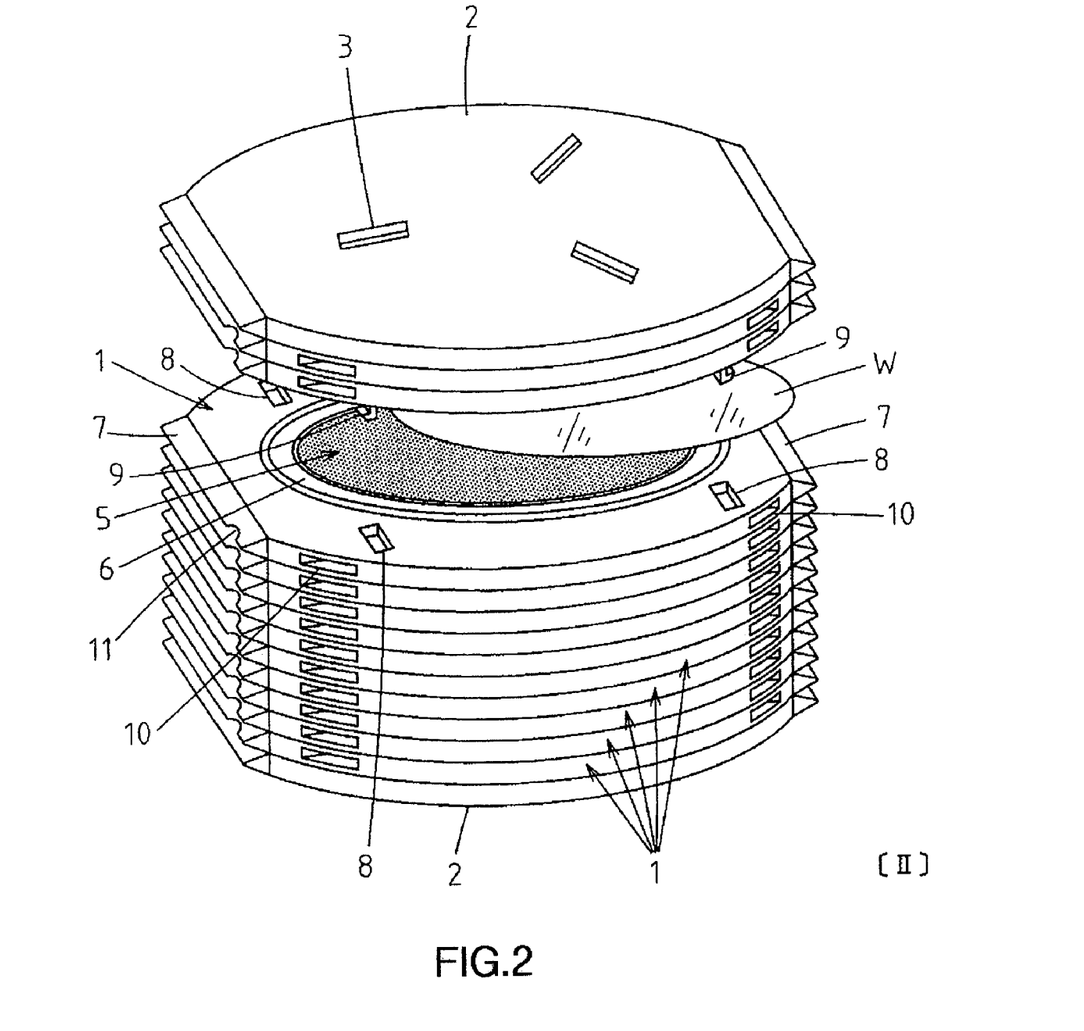
[FIG. 2] is a perspective view of a multiplicity of superimposed wafer trays of a cushioned wafer container according to the first embodiment of the present invention, showing a state where a part of the superimposed wafer trays is separated from the rest thereof.

FIG. 2 shows the general arrangement of a wafer container with cushion sheets. The wafer container has a plurality of vertically superimposed horizontal wafer trays 1 for retaining semiconductor wafers W thereon, respectively. It should be noted that FIG. 2 shows the wafer container in a state where a part of superimposed wafer trays 1 is separated from the rest thereof. A pair of base trays 2 are attached to the upper and lower ends of the stack of superimposed wafer trays 1. The base trays 2 are provided with connecting grooves 3 for connection with mechanical interfaces (not shown).

The wafer trays 1 are molded from a plastic material, e.g. a polycarbonate resin. When the wafer trays 1 are superimposed over each other, a semiconductor wafer W placed over each wafer tray 1 is accommodated in an interior space formed between the wafer tray 1 and another wafer tray 1 adjacently superimposed thereover. It should be noted, however, that the semiconductor wafer W is not placed directly on the wafer tray 1 but on a wafer-retaining cushion sheet 5 (hereinafter referred to simply as "retaining cushion 5") secured to the top of the wafer tray 1.

An elastic annular seal member 6 is disposed outside the periphery of the retaining cushion 5 so as to surround it entirely. Each wafer tray 1 has grips 7 formed at 180° symmetric positions on the outer edge thereof to enable each wafer tray 1 to be individually held by a machine.

Each wafer tray 1 has connecting holes 8 formed on the top thereof at respective positions (e.g. four positions) closer to the outer edge thereof than the annular seal member 6 to connect the wafer tray 1 to another wafer tray 1 superimposed thereover. Correspondingly to the connecting holes 8, downwardly projecting connecting hooks 9 are formed at four positions on the bottom of each wafer tray 1 so as to disengageably engage with the connecting holes 8.

Thus, the connecting holes 8 and the connecting hooks 9 constitute a tray connecting mechanism for releasably connecting together a plurality of superimposed wafer trays 1 into a stack such that the stack of superimposed wafer trays 1 can be disconnected at any desired position in the stack. Reference numeral 10 denotes key holes 10 for insertion of an unhook key (not shown) for disengaging the connecting hooks 9 from the connecting holes 8. Reference numeral 11 denotes an air inlet for supplying pressurized air from the outside to remove the semiconductor wafer W from the wafer tray 1, which will be detailed later.

Figure 3:
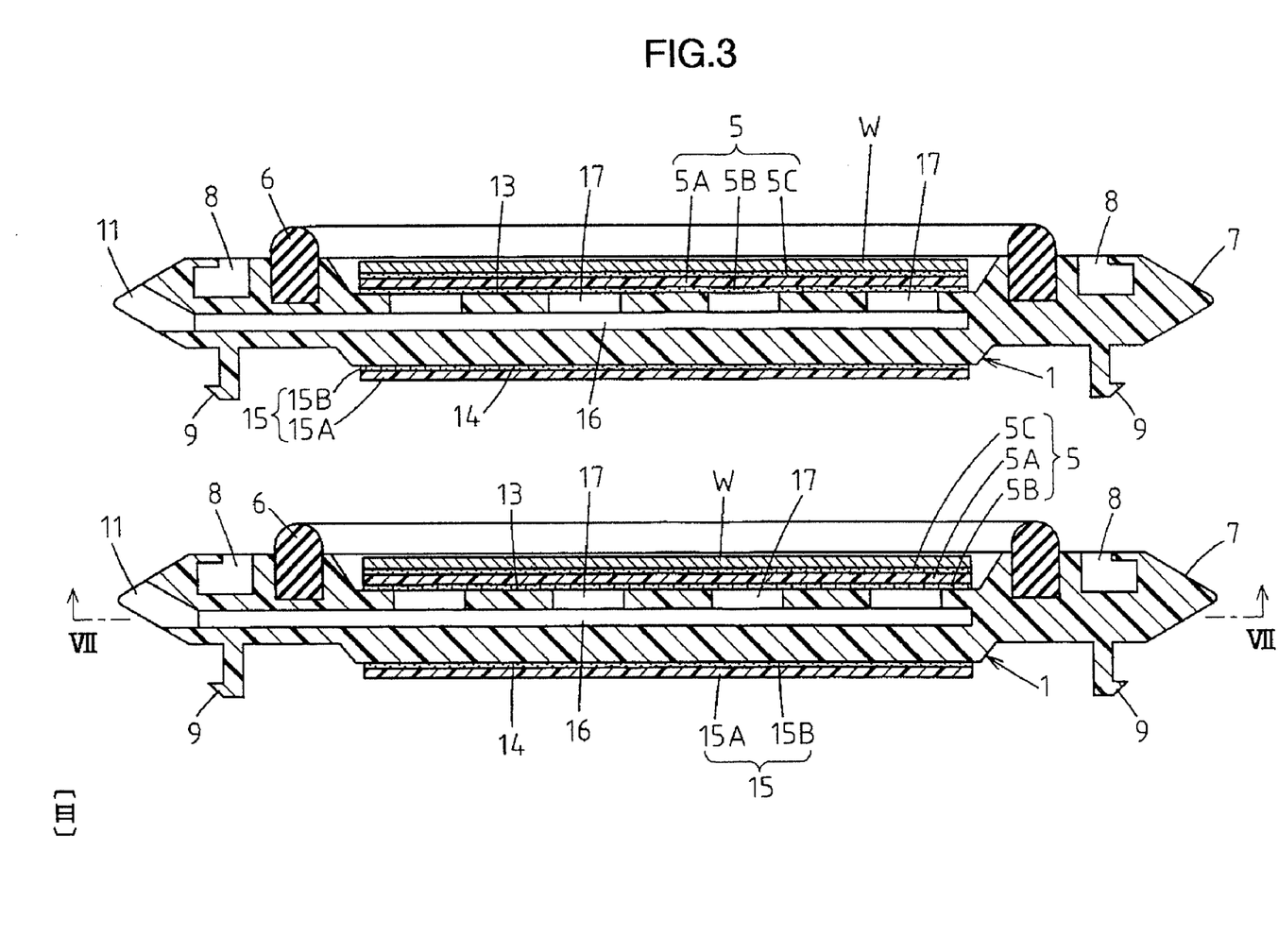
[FIG. 3] is a sectional side view of two wafer trays as being separate from each other in the first embodiment of the present invention.
Figure 4:
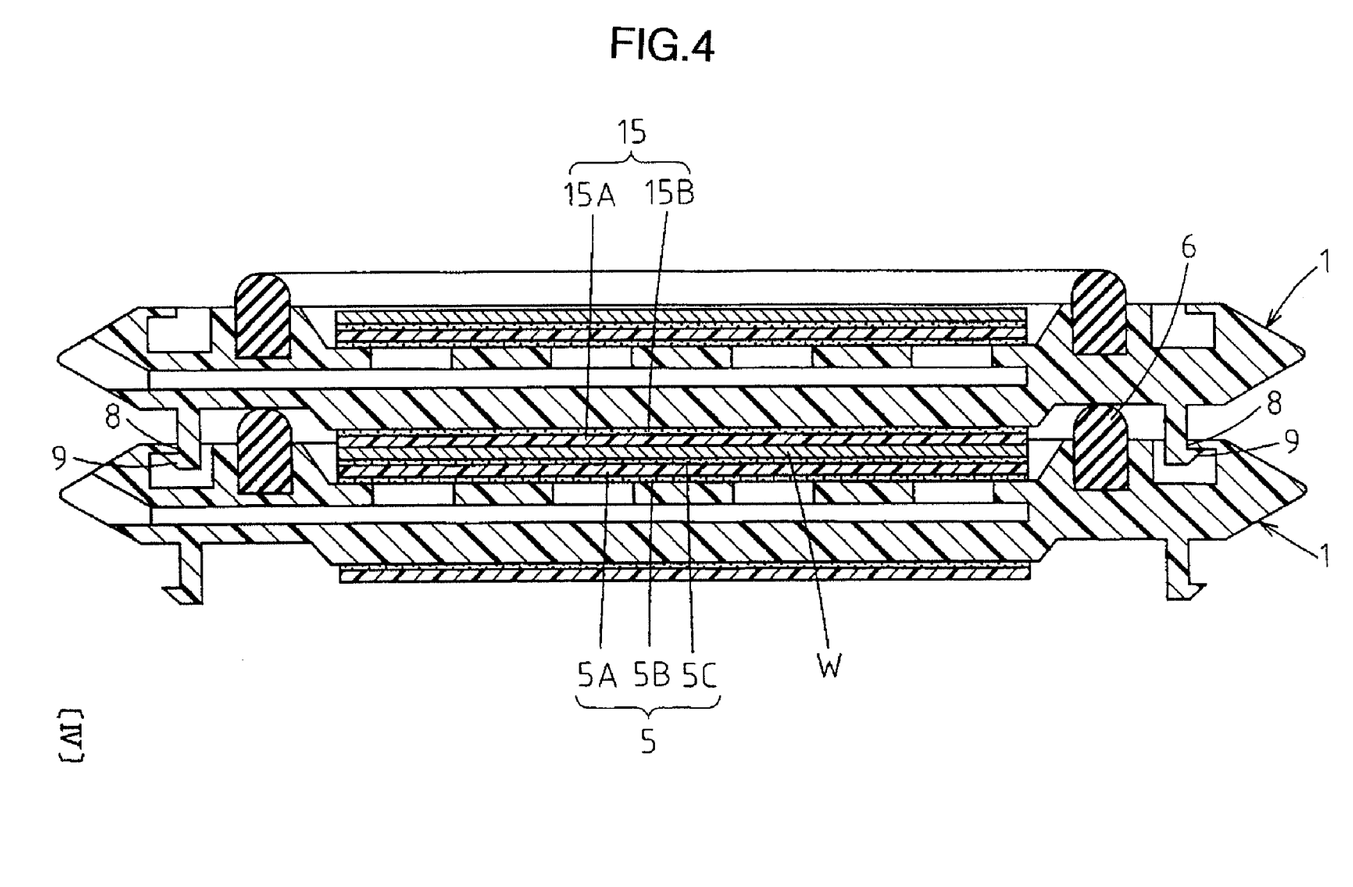
[FIG. 4] is a sectional side view of two wafer trays as connected together in the first embodiment of the present invention.

FIGS. 3 and 4 are sectional side views showing, respectively a state where a pair of vertically adjacent wafer trays 1 are separate from each other and a state where these wafer trays 1 are superimposed over each other. It should be noted that, in these figures, sectional views taken at different positions are combined together to show the sections of the connecting hooks 9, the air inlets 11, etc. in a single drawing. The annular seal member 6 on each wafer tray 1 is disposed in such a manner that the lower half thereof is fitted into an annular groove formed on the top of the wafer tray 1 at a position slightly inward of the outer edge thereof. Each wafer tray 1 is formed in a dish-like shape. That is, the top of the wafer tray 1 is recessed at a portion thereof located inward of the annular seal member 6, and a portion of the bottom of the wafer tray 1 that is located inward of the annular seal member 6 projects downward. The retaining cushion 5 is disposed in the recessed portion of the top of the wafer tray 1.

The retaining cushion 5 is formed into a disk-like shape of a size sufficiently large to retain substantially the whole surface of a semiconductor wafer W by using a material that has no chemically adverse effect on the semiconductor wafer W throughout it, e.g. a material that will not generate impurity gas more than a prescribed amount. The retaining cushion 5 comprises an integrated stack of three layers: a cushion layer 5A functioning as an elastic cushion that protects the semiconductor wafer W from an external impact or the like; a tray suction-adhering layer 5B having a tray suction-adhering surface that releasably adheres by suction to the top 13 of the wafer tray 1; and a wafer suction-adhering layer 5C having a wafer suction-adhering surface that releasably adheres by suction to the semiconductor wafer W. Among the three layers, the cushion layer 5A is formed of an elastic polymer material, e.g. a foamed polymer material, such as foamed urethane, or an elastomeric polymer material.

Figure 5:
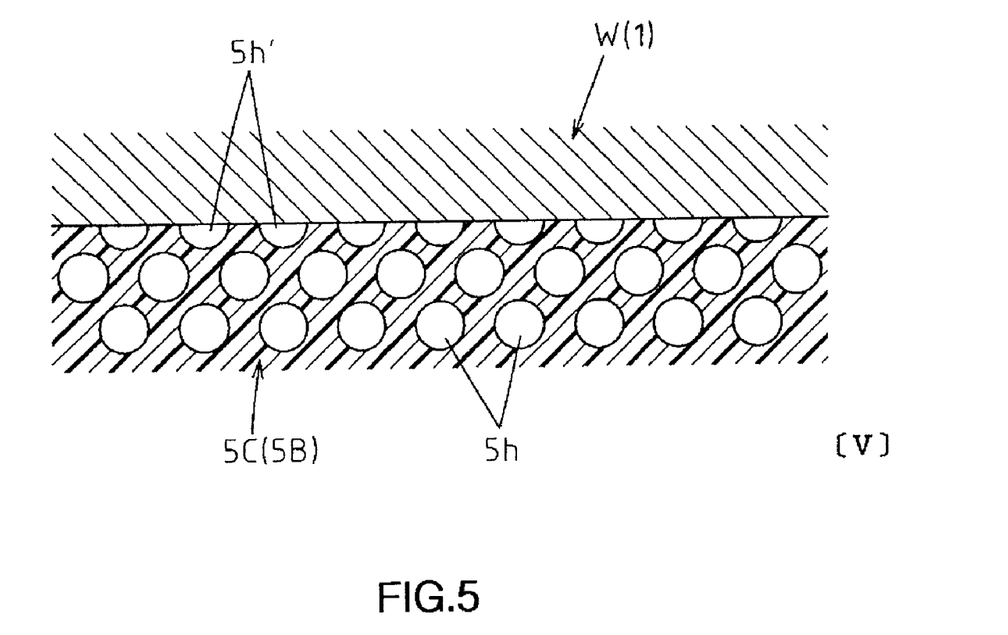
[FIG. 5] is a schematic sectional view of a suction-adhering layer removably attached by suction to a semiconductor wafer or to the bottom of a wafer tray in the first embodiment of the present invention.

The tray suction-adhering layer 5B and the wafer suction-adhering layer 5C, which are provided on the obverse and reverse sides, respectively, of the cushion layer 5A, are each formed of a material that is unlikely to have a chemically adverse effect on the surroundings, e.g. a foamed rubber polymer material such as a foamed acrylic latex consisting essentially of an acrylic ester copolymer, a foamed elastomeric polymer material, or a foamed urethane polymer material. As schematically shown in FIG. 5, the tray suction-adhering layer 5B and the wafer suction-adhering layer 5C are formed from a foam material and hence each have a large number of cells 5$h$ formed therein. Of the cells 5$h$, cells 5$h'$ that are open to the outside air function as minute suction cups, respectively.

Accordingly, the whole exposed surface of each of the tray and wafer suction-adhering layers 5B and 5C form minute suction cups (it should be noted that minute suction cups may be formed only on a part of the exposed surface). By pressing the minute suction cups to an adherend, i.e. the top 13 of the wafer tray 1 or the semiconductor wafer W, the minute suction cups are secured by suction to the top 13 of the wafer tray 1 or the semiconductor wafer W. It should be noted that the top 13 of the wafer tray 1 and the surface of the semiconductor wafer W are preferably smooth surfaces to ensure the adhesive force required for this purpose. It is also preferable that the minute suction cups (cells 5$h'$) of the suction-adhering layers 5B and 5C have an average diameter of not less than about 10 μm and not more than about 50 μm. It should be noted that the cells 5$h$ may be either open cells or closed cells. In FIG. 5, the cells 5$h$ are simplified and schematically shown.

With the above-described arrangement, when a semiconductor wafer W is placed on a wafer tray 1, as shown in FIG. 3, the reverse side of the retaining cushion 5 is airtightly secured by suction to the top 13 of the wafer tray 1, and the semiconductor wafer W is secured by suction to the wafer suction-adhering layer 5C at the top of the retaining cushion 5. Accordingly, even if the wafer tray 1 is tilted during an operation of separating two wafer trays 1 from each other or during inspection of the semiconductor wafer W, there is no likelihood that the retaining cushion 5 will slide off the wafer tray 1 and that the semiconductor wafer W will slide off the retaining cushion 5. In addition, the semiconductor wafer W is always kept flat without being warped because it is secured by suction to the top of the retaining cushion 5. Therefore, it is possible to prevent damage to the semiconductor wafer W that might otherwise be caused by repeated change between the state of being flat and the state of being warped.

Figure 6:
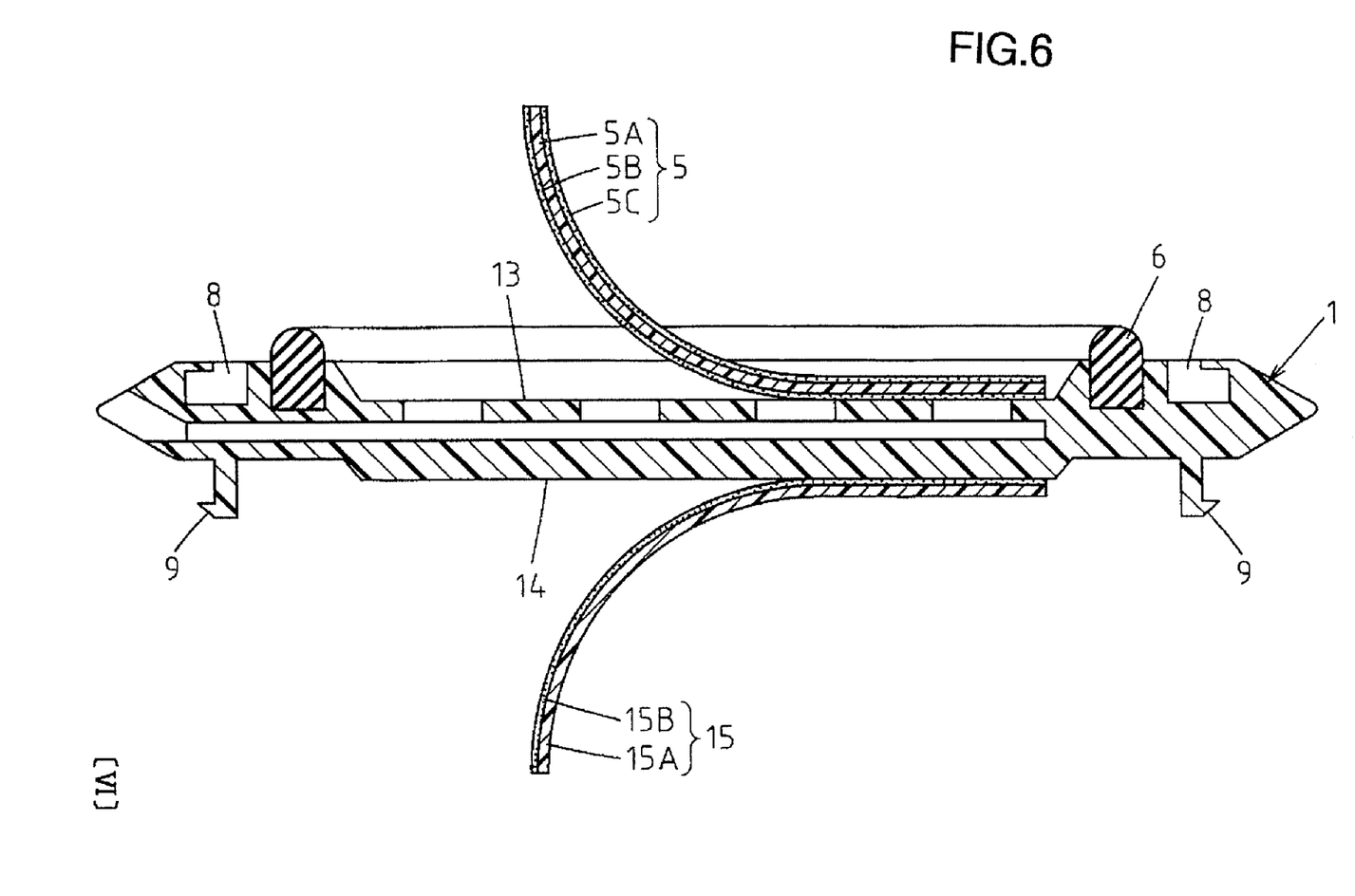
[FIG. 6] is a sectional side view showing the way in which a cushion sheet is removed from a wafer tray in the first embodiment of the present invention.

The retaining cushion 5 can be readily removed from the top 13 of the wafer tray 1 for washing or replacement, as shown in FIG. 6, by an operator holding it between his or her fingers and pulling it with a certain force. It should be noted, however, that the adhesive force of the wafer suction-adhering layer 5C of the retaining cushion 5 relative to the semiconductor wafer W should preferably be set smaller than the adhesive force of the tray suction-adhering layer 5B of the retaining cushion 5 relative to the top 13 of the wafer tray 1 to prevent the retaining cushion 5 from being undesirably removed from the wafer tray 1 before the semiconductor wafer W is removed from the retaining cushion 5. Such adhesive force setting may be realized, for example, by making the respective cells 5h of the suction-adhering layers 5B and 5C appropriately different in diameter or density from each other.

Each wafer tray 1 has an elastic wafer-pressing cushion sheet 15 (hereinafter referred to simply as "pressing cushion 15") removably attached by suction to the bottom 14 thereof to press the underlying semiconductor wafer W against the retaining cushion 5 of the lower adjacent wafer tray 1.

The pressing cushion 15 in this embodiment is formed in a disk-like shape of a size sufficiently large to press a predetermined region of the semiconductor wafer W or substantially the whole surface thereof by using a material that has no chemically adverse effect on the semiconductor wafer W, in the same way as the retaining cushion 5. Specifically, the pressing cushion 15 comprises an integrated stack of two layers: a cushion layer 15A functioning as an elastic cushion; and a suction-adhering layer 15B having a suction-adhering surface that is removably secured by suction to the bottom 14 of the wafer tray 1.

The cushion layer 15A and the suction-adhering layer 15B, which form the pressing cushion 15 in this embodiment, are arranged in the same way as the cushion layer 5A and the tray suction-adhering layer 5B (or the wafer suction-adhering layer 5C), which form the above-described retaining cushion 5. Accordingly, the pressing cushion 15 can be removably secured by suction to the bottom 14 of the wafer tray 1. The pressing cushion 15 can be readily removed from the bottom 14 of the wafer tray 1 for washing or replacement, as shown in FIG. 6, by an operator holding it with his or her fingers and pulling it with a certain force.

It should be noted that the retaining cushion 5 and the pressing cushion 15 may be fixed to the wafer tray 1 by mechanical fixing means using a fixing frame or the like or by thermowelding or other similar means. If the retaining cushion 5 is fixed to the top 13 of the wafer tray 1 (airtightly at least at the outer peripheral portion thereof), the restriction on the pressure of pressurized air (described later) is reduced advantageously, and so is the restriction on the adhesive force between the retaining cushion 5 and the semiconductor wafer W.

Referring back to FIGS. 3 and 4, each wafer tray 1 has an air chamber 16 formed in the bottom wall in communication with the above-described air inlet 11. The top 13 of the wafer tray 1 has a plurality of bottom openings 17 formed at respective positions that face the tray suction-adhering layer 5B on the reverse side of the retaining cushion 5. The bottom openings 17 communicate directly with the air chamber 16.

Figure 7:
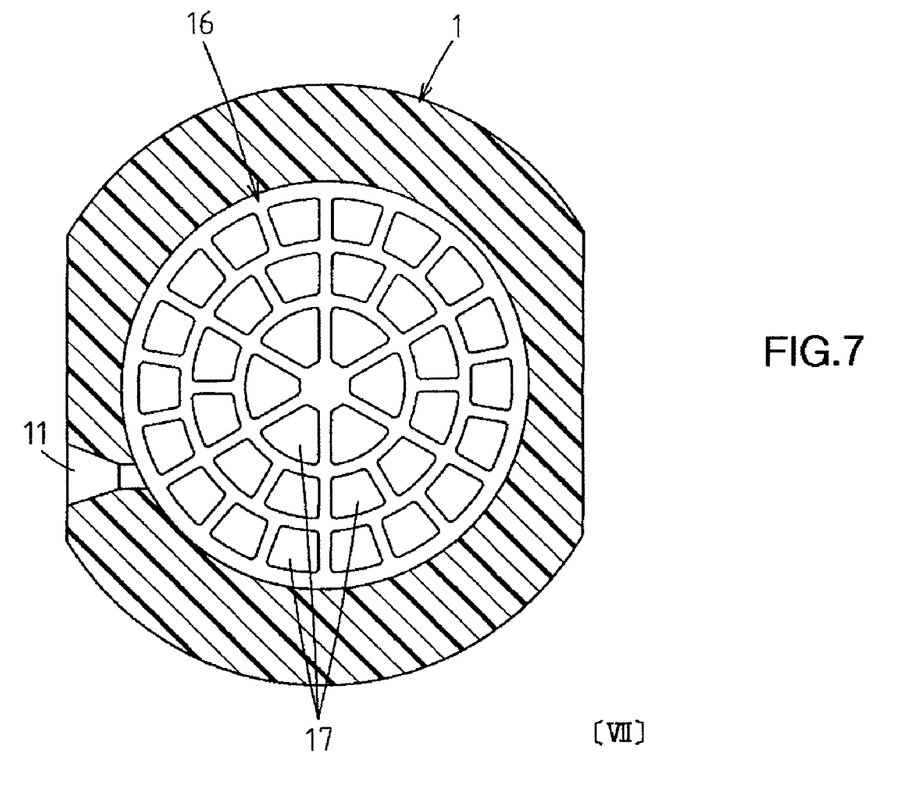
[FIG. 7] is a sectional view of a wafer tray in the first embodiment of the present invention taken along the line VII-VII in FIG. 3.

More specifically, a large number (e.g. from about 20 to about 1000) of bottom openings 17 are evenly distributed throughout a region facing the reverse side of the retaining cushion 5, as also shown in FIG. 7, which is a sectional view taken along the line VII-VII in FIG. 3. For example, the bottom openings 17 are so formed that the total area thereof is not less than a half of the area of the semiconductor wafer W. The air chamber 16 is formed by hollowing the wafer tray 1 into a single disk-like space communicating directly with all the bottom openings 17. In a case where the air chamber 16 needs to be prevented from being crushed by an external force, pillar-shaped members or the like should preferably be disposed appropriately in the air chamber 16. The air inlet 11 communicates directly with an outer peripheral portion of the air chamber 16.

Figure 1:
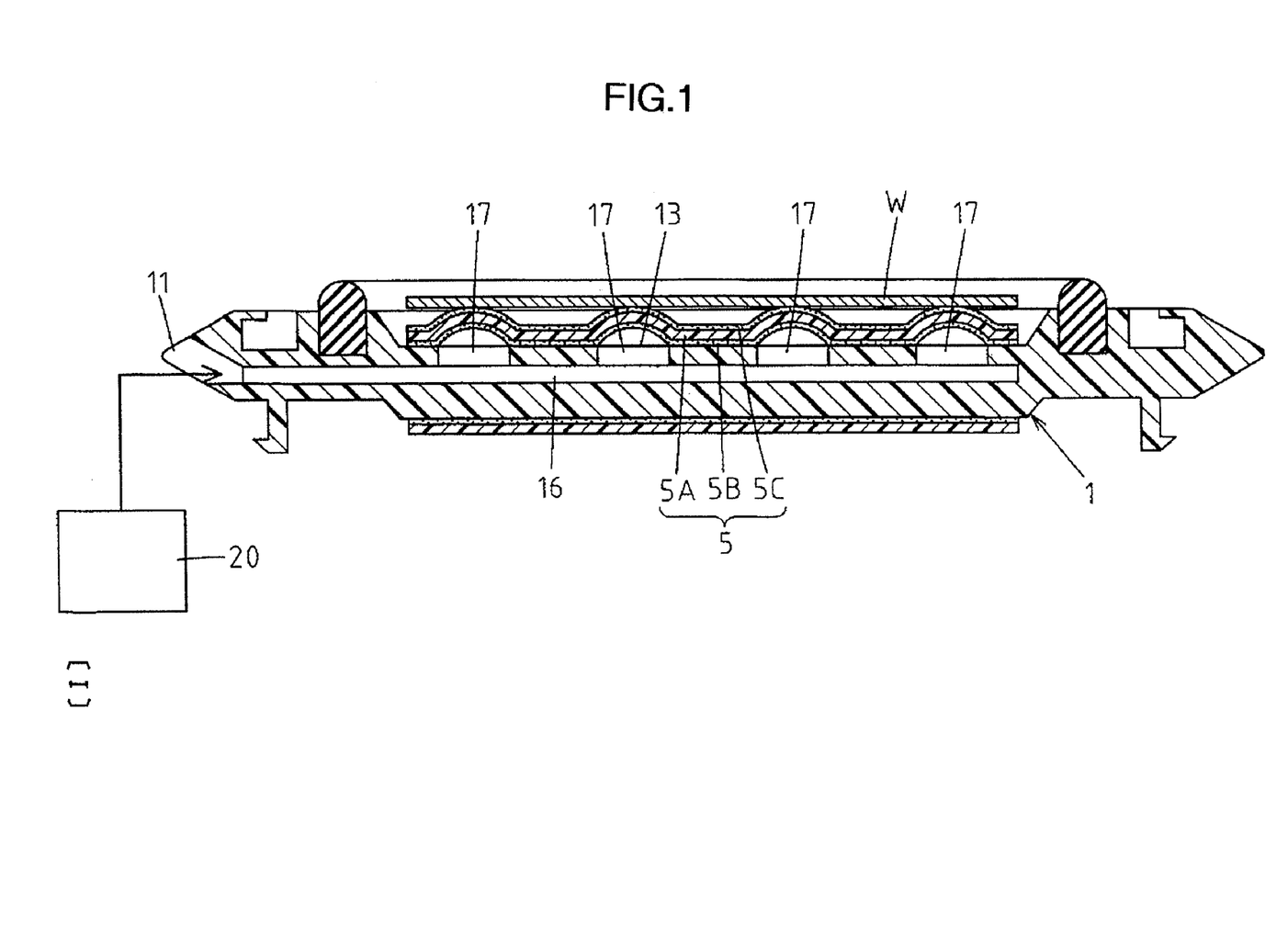
[FIG. 1] is a sectional side view showing the way in which a semiconductor wafer is removed from a wafer tray in a first embodiment of the present invention.

With the above-described arrangement, as shown in FIG. 1, when pressurized air is supplied into the air chamber 16 through the air inlet 11 by a pressurizing pump 20 or the like to increase the air pressure in the air chamber 16, the retaining cushion 5 is elastically deformed into an outwardly inflated form at regions facing the bottom openings 17. Consequently, the semiconductor wafer W separates from the wafer suction-adhering layer 5C of the retaining cushion 5 at regions thereof other than those on the tops of the inflated portions thereof and their vicinities.

Accordingly, thereafter, the semiconductor wafer W can be separated from the retaining cushion 5 with a light force. Thus, the semiconductor wafer W can be readily removed from the retaining cushion 5 without damaging it. If the retaining cushion 5 is pulled with a larger force than the force for separating the semiconductor wafer W from the retaining cushion 5, the retaining cushion 5 can be separated from the top 13 of the wafer tray 1 for washing or replacement according to need, as has been stated above.

Referring back to FIGS. 3 and 4 again, each connecting hook 9 has an elongated stem portion projecting from the bottom 14 of the wafer tray 1 and an outwardly bent L-shaped hook portion integrally formed at the distal end of the stem portion. Accordingly, as shown in FIG. 4, when a wafer tray 1 is superimposed over a lower wafer tray 1 and pressed against the latter, the hook portion of each connecting hook 9 enters the associated connecting hole 8 while elastically deforming the stem portion thereof. After the hook portion has entered the connecting hole 8, the connecting hook 9 returns to its previous form before the elastic deformation. As a result, the hook portion of the connecting hook 9 is undisengageably engaged in the connecting hole 8, and thus the two superimposed wafer trays 1 are connected to each other.

Consequently, the annular seal member 6 fitted to the lower wafer tray 1 is pressed and elastically deformed over its entire periphery by the bottom 14 of the upper wafer tray 1. Thus, the space accommodating the semiconductor wafer W inside the annular seal member 6 is sealed off from the outside. As a result, the semiconductor wafer W placed on the lower wafer tray 1 is elastically held between the retaining cushion 5 of the lower wafer tray 1 and the pressing cushion 15 of the upper wafer tray 1. Thus, the semiconductor wafer W is retained safely without being directly subjected to an external influence such as an impact.

Figure 8:
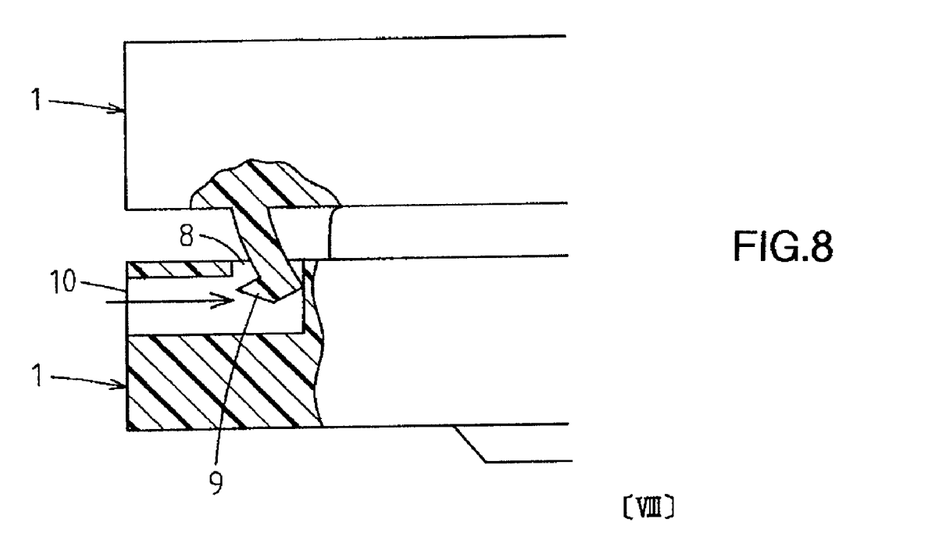
[FIG. 8] is a fragmentary sectional view showing the way in which two wafer trays are disconnected from each other in the first embodiment of the present invention.

Thus, an appropriate number of wafer trays 1 respectively retaining semiconductor wafers W are superimposed over each other and connected together, and in this state, the semiconductor wafers W can be safely transported and stored. When a wafer tray 1 is to be separated from the stack of superimposed wafer trays 1, as shown in FIG. 8, an unhook key (not shown) is inserted into the key hole 10, causing the stem portion of the connecting hook 9 to be elastically deformed so that the connecting hook 9 is disengageable from the connecting hole 8. Accordingly, the upper wafer tray 1 can be lifted and separated from the lower wafer tray 1.

Incidentally, the semiconductor wafer W generally has a surface electrical resistance of the order of $10^9 \Omega$. Therefore, if the retaining cushion 5 and the pressing cushion 15, which contact the obverse and reverse sides, respectively, of the semiconductor wafer W, are designed to have a surface electrical resistance substantially equal to that of the semiconductor wafer W, it is possible to suppress adhesion of dust to the surface of contact with the semiconductor wafer W and electrically adverse effect on electronic circuits formed on the semiconductor wafer W. Accordingly, it is preferable that at least either of the retaining cushion 5 and the pressing cushion 15 should have a surface electrical resistance in the range of from $10^8\Omega$ to $10^{10}\Omega$. It is most desirable that both the retaining cushion 5 and the pressing cushion 15 should have a surface electrical resistance of the order of $10^9\Omega$, i.e. the same surface electrical resistance as that of the semiconductor wafer W.

Figure 9:
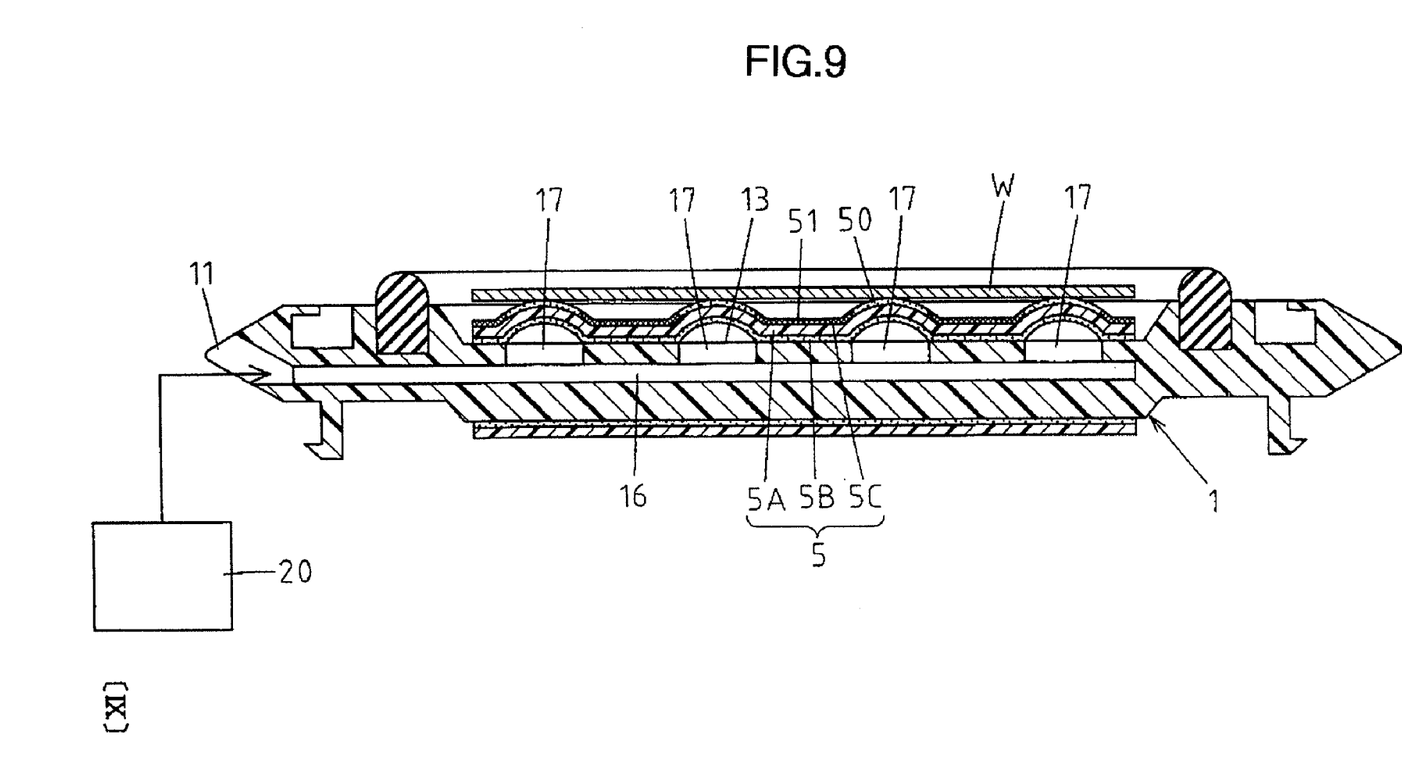
[FIG. 9] is a sectional side view showing the way in which a semiconductor wafer is removed from a wafer tray in a second embodiment of the present invention.
Figure 10:
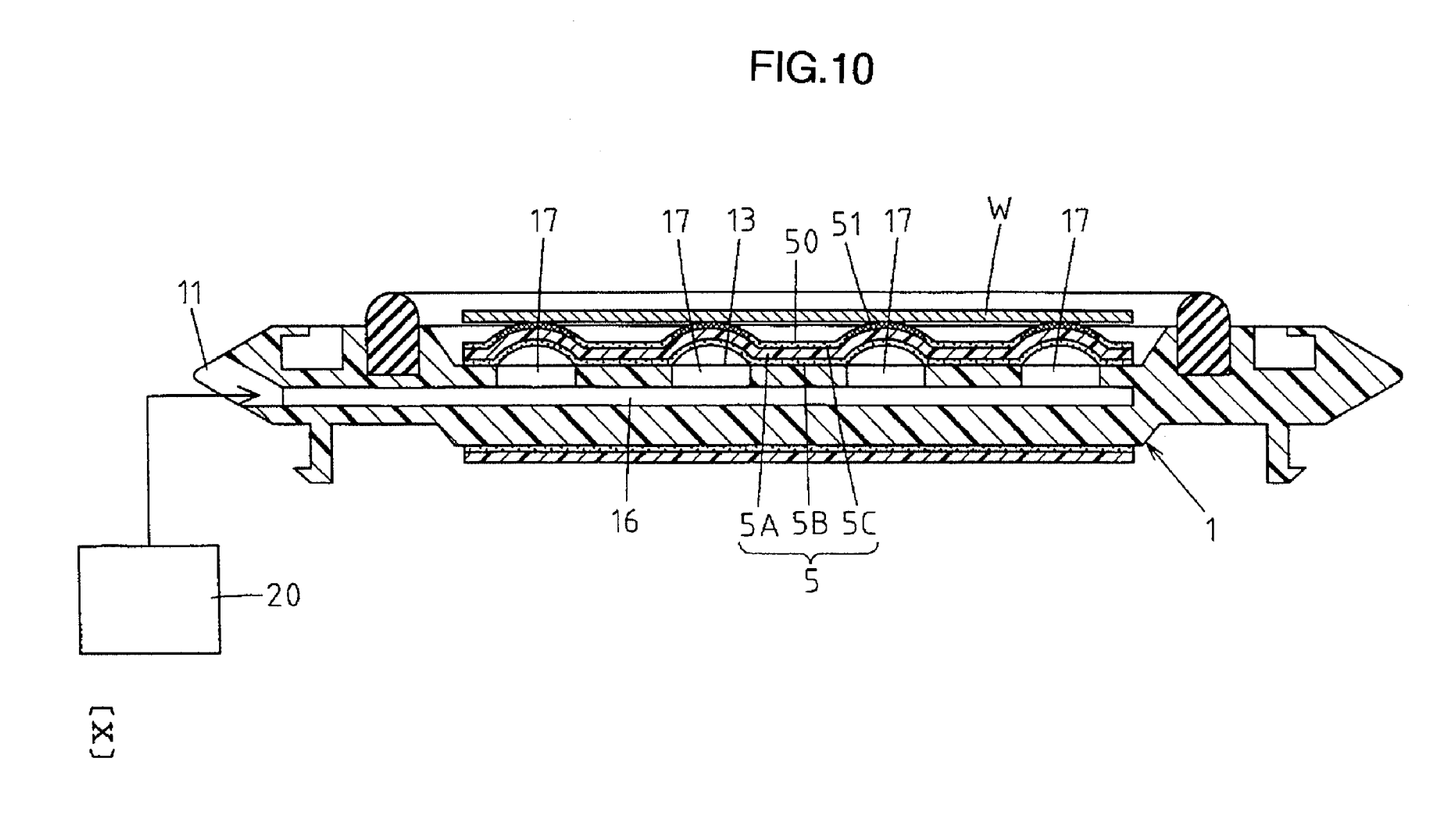
[FIG. 10] is a sectional side view showing the way in which a semiconductor wafer is removed from a wafer tray in a third embodiment of the present invention.

FIGS. 9 and 10 respectively show second and third embodiments of the present invention, each illustrating the way in which a semiconductor wafer W is removed from a wafer tray 1. In these embodiments, only some regions of the wafer suction-adhering layer 5C of the retaining cushion 5 serve as wafer suction-adhering surfaces 50 that adhere by suction to the semiconductor wafer W. The remaining regions of the wafer suction-adhering layer 5C are non-adhering surfaces 51 that do not adhere by suction to the semiconductor wafer W. In the second embodiment shown in FIG. 9, wafer suction-adhering surfaces 50 are formed only at positions coincident with the bottom openings 17 formed in the wafer tray 1. In the third embodiment shown in FIG. 10, wafer suction-adhering surfaces 50 are formed only at positions not coincident with the bottom openings 17 formed in the wafer tray 1. With these arrangements, the semiconductor wafer W and the retaining cushion 5 can be separated from each other even more easily by pressurized air blown in from the air inlet 11.

Figure 11:
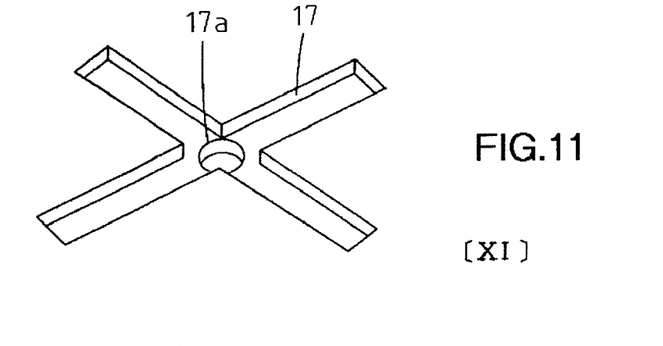
[FIG. 11] is a perspective view of a bottom opening provided in a wafer tray in a fourth embodiment of the present invention.

FIG. 11 shows one of bottom openings 17 in a fourth embodiment of the present invention. In this embodiment, each bottom opening 17 formed in the wafer tray 1 is a cross-shaped groove. Reference numeral 17a denotes an air hole communicating with the air chamber 16. The bottom openings 17 formed in such a shape offer the following advantageous effect. When the pressure of pressurized air acts on the retaining cushion 5 from the bottom openings 17, the retaining cushion 5 is gradually deformed from portions thereof extending along the bottom openings 17. As the deformation gradually develops around the bottom openings 17, the semiconductor wafer W and the retaining cushion 5 gently separate from each other. Therefore, the impact applied to the semiconductor wafer W can be reduced. It should be noted that the bottom openings 17 may be formed in a groove shape extending radially outward from the center of each bottom opening 17, e.g. a spiral groove, or a multiplicity of straight radial grooves.

Figure 12:
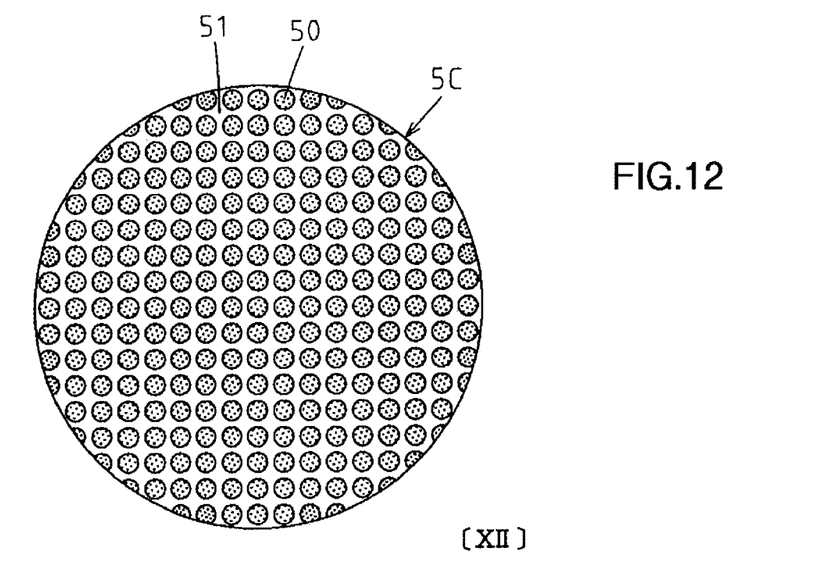
[FIG. 12] is a plan view of a wafer-retaining cushion sheet in a fifth embodiment of the present invention.
Figure 13:
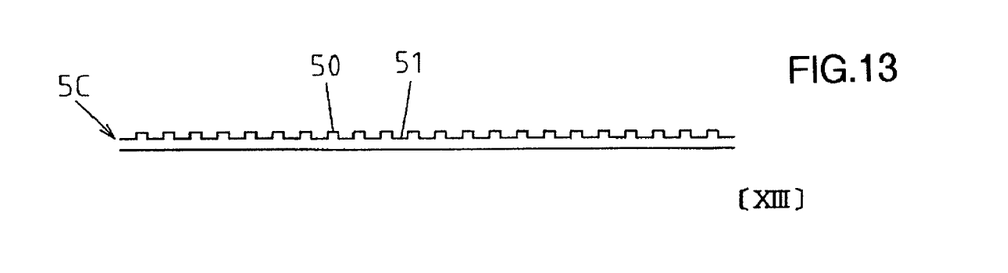
[FIG. 13] is a sectional view of the wafer-retaining cushion sheet in the fifth embodiment of the present invention.
Figure 14:
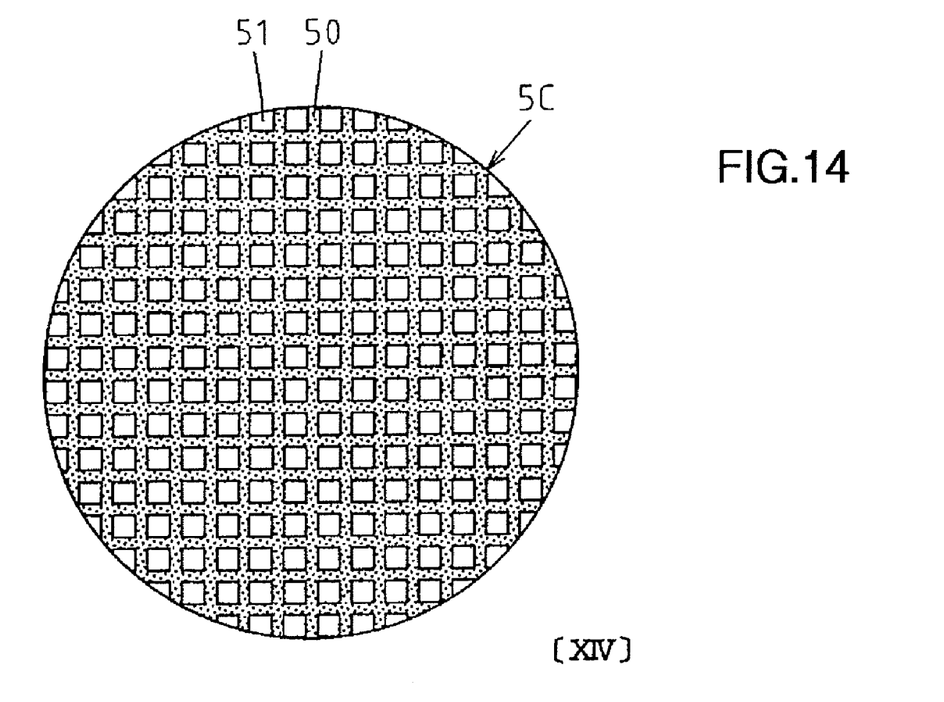
[FIG. 14] is a plan view of a wafer-retaining cushion sheet in a sixth embodiment of the present invention.

FIG. 12 shows the wafer suction-adhering layer 5C of the retaining cushion 5 in a fifth embodiment of the present invention. In this embodiment, not the whole surface of the retaining cushion 5 forms a wafer suction-adhering surface 50 that adheres by suction to the semiconductor wafer W, but a multiplicity of wafer suction-adhering surfaces 50 are distributed at regular intervals and at a uniform density, and the rest of the wafer suction-adhering layer 5C forms non-adhering surfaces 51 that do not adhere by suction to the semiconductor wafer W. FIG. 13 is a sectional view of the wafer suction-adhering layer 5C. As shown in FIG. 13, if unevenness is formed on the surface of the wafer suction-adhering layer 5C, projections form wafer suction-adhering surfaces 50, and hollows (i.e. recessed portions) form non-adhering surfaces 51. Alternatively, the non-adhering surfaces 51 may be formed by thermal processing. The adhesive force of the wafer suction-adhering layer 5C can be set as desired by selecting an appropriate density of wafer suction-adhering surfaces 50 as stated above. The wafer suction-adhering surfaces 50 may be formed at different densities in different regions. The wafer suction-adhering surfaces 50 may be formed in a mesh-like continuous structure as shown in FIG. 14, which illustrates a sixth embodiment of the present invention.

Figure 15:
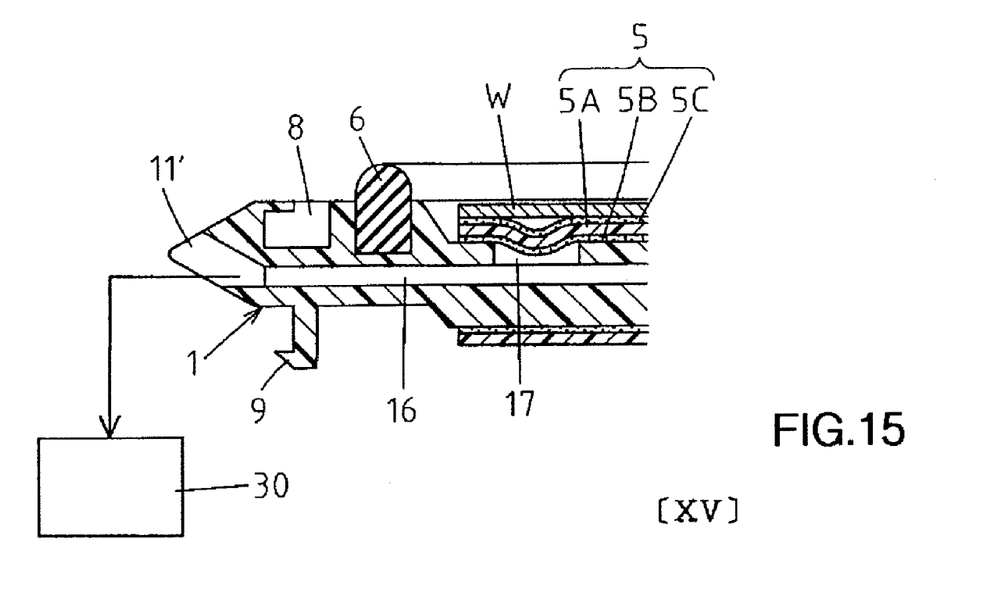
[FIG. 15] is a fragmentary sectional side view showing the way in which a semiconductor wafer is removed from a wafer tray in a seventh embodiment of the present invention.

FIG. 15 shows a seventh embodiment of the present invention. In this embodiment, the air inlet 11 of the wafer tray 1 is replaced by a suction port 11' for externally sucking out air from the air chamber 16. That is, the air in the air chamber 16 is sucked out through the suction port 11' by a suction pump 30 or the like to reduce the air pressure in the air chamber 16, thereby causing the retaining cushion 5 to be elastically deformed in the state of being sucked toward the bottom openings 17 at regions thereof facing the bottom openings 17, and thus separating a part or the whole of the wafer suction-adhering layer 5C of the retaining cushion 5 from the semiconductor wafer W. It should be noted that it is preferable in this embodiment to form wafer suction-adhering surfaces 50 only at positions coincident with the bottom openings 17 formed in the wafer tray 1, in the same way as in the second embodiment shown in FIG. 9.

The seventh embodiment may adopt arrangements similar to those of the foregoing embodiments with regard to the contents of the following items (1) to (8):

(1) A tray suction-adhering surface (5B) that airtightly adheres by suction to the top 13 of the wafer tray 1 is formed on the reverse side of the retaining cushion 5.

(2) Regarding the respective adhesive forces of the wafer suction-adhering surface (5C) and tray suction-adhering surface (5B) of the retaining cushion 5, the adhesive force of the wafer suction-adhering surface (5C) relative to the semiconductor wafer W is set smaller than the adhesive force of the tray suction-adhering surface (5B) relative to the top 13 of the wafer tray 1.

(3) The retaining cushion 5 comprises an integrated stack of a tray suction-adhering layer 5B having a tray suction-adhering surface, a cushion layer 5A functioning as an elastic cushion, and a wafer suction-adhering layer 5C having a wafer suction-adhering surface.

(4) The cushion layer 5A is formed of an elastic elastomeric polymer material or an elastic foamed polymer material.

(5) A plurality of bottom openings 17 are evenly distributed throughout a region facing the reverse side of the retaining cushion 5.

(6) An elastic pressing cushion 15 is disposed on the bottom 14 of each wafer tray 1 to press the semiconductor wafer W against the retaining cushion 5.

(7) At least either of the retaining cushion 5 and the pressing cushion 15 has a surface electrical resistance in the range of from $10^8\Omega$ to $10^{10}\Omega$.

(8) Connecting holes 8 and connecting hooks 9 (tray connecting mechanism) are provided to releasably connect together a plurality of superimposed wafer trays 1 into a stack such that the stack of superimposed wafer trays 1 can be disconnected at any desired position in the stack.

It should be noted that the present invention is not limited to the foregoing embodiments. For example, the tray connecting mechanism is not limited to the structure in which the connecting hooks 9 are engaged in the connecting holes 8, but may be any other tray connecting structure.

The invention claimed is:

1. A cushioned wafer container comprising:
a plurality of mutually superimposed wafer trays each for retaining a semiconductor wafer; and
an elastic wafer-retaining cushion sheet attached to a top of each of said wafer trays to place said semiconductor wafer thereon;
wherein said semiconductor wafer placed on a surface of said wafer-retaining cushion sheet is accommodated in an interior space formed between each of said wafer trays and another of said wafer trays that is adjacently superimposed thereover;

said wafer container further comprising:

a wafer suction-adhering surface formed on the surface of said wafer-retaining cushion sheet, said wafer suction-adhering surface adhering by suction to said semiconductor wafer;

said wafer trays each being provided with a plurality of bottom openings opening to a reverse side of said wafer-retaining cushion sheet, an air chamber communicating with said bottom openings, and an air inlet for supplying pressurized air into said air chamber from an outside;

wherein when pressurized air is supplied into said air chamber through said air inlet to increase air pressure in said air chamber, said wafer-retaining cushion sheet is elastically deformed into an upwardly inflated form at regions facing said bottom openings, thus causing separation between said semiconductor wafer and at least a part of the wafer suction-adhering surface of said wafer-retaining cushion sheet.

2. The cushioned wafer container of claim 1, wherein the wafer suction-adhering surface of said wafer-retaining cushion sheet is formed by a multiplicity of minute suction cups, so that pressing said minute suction cups against said semiconductor wafer causes said semiconductor wafer to be secured by suction to said minute suction cups.

3. The cushioned wafer container of claim 1, wherein said wafer-retaining cushion sheet has a size sufficiently large to retain substantially a whole surface of said semiconductor wafer, said wafer suction-adhering surface being formed on at least a part of an obverse side of said wafer-retaining cushion sheet.

4. The cushioned wafer container of claim 3, wherein said wafer suction-adhering surface is formed only at positions of said wafer-retaining cushion sheet that are coincident with said bottom openings formed in each of said wafer trays.

5. The cushioned wafer container of claim 3, wherein said wafer suction-adhering surface is formed only at positions of said wafer-retaining cushion sheet that are not coincident with said bottom openings formed in each of said wafer trays.

6. The cushioned wafer container of claim 3, wherein said wafer suction-adhering surface is distributed on said wafer-retaining cushion sheet at a uniform density or at locally different densities.

7. The cushioned wafer container of claim 6, wherein a remaining part of the obverse side of said wafer-retaining cushion sheet other than said wafer suction-adhering surface is recessed from said wafer suction-adhering surface.

8. The cushioned wafer container of claim 1, wherein a tray suction-adhering surface that airtightly adheres by suction to the top of said wafer tray is formed on the reverse side of said wafer-retaining cushion sheet.

9. The cushioned wafer container of claim 8, wherein, regarding respective adhesive forces of the wafer suction-adhering surface and tray suction-adhering surface of said wafer-retaining cushion sheet, the adhesive force of said wafer suction-adhering surface relative to said semiconductor wafer is set smaller than the adhesive force of said tray suction-adhering surface relative to the top of said wafer tray.

10. The cushioned wafer container of claim 8, wherein said wafer-retaining cushion sheet comprises an integrated stack of a tray suction-adhering layer having said tray suction-adhering surface, a cushion layer functioning as an elastic cushion, and a wafer suction-adhering layer having said wafer suction-adhering surface.

11. The cushioned wafer container of claim 10, wherein said cushion layer is formed of one of an elastic elastomeric polymer material and an elastic foamed polymer material.

12. The cushioned wafer container of claim 1, wherein said bottom openings are evenly distributed throughout a region facing the reverse side of said wafer-retaining cushion sheet.

13. The cushioned wafer container of claim 1, wherein said bottom openings formed in said wafer tray each have a groove shape extending radially outward from a center thereof.

14. The cushioned wafer container of claim 1, further comprising:

an elastic wafer-pressing cushion sheet disposed on a bottom of each of said wafer trays to press said semiconductor wafer against said wafer-retaining cushion sheet.

15. The cushioned wafer container of claim 14, wherein at least one of said wafer-retaining cushion sheet and said wafer-pressing cushion sheet has a surface electrical resistance in a range of from $10^8 \Omega$ to $10^{10} \Omega$.

16. The cushioned wafer container of claim 1, further comprising:

a tray connecting mechanism for releasably connecting together said mutually superimposed wafer trays into a stack such that the stack of said superimposed wafer trays can be disconnected at any desired position in the stack.

17. A cushioned wafer container comprising:

a plurality of mutually superimposed wafer trays each for retaining a semiconductor wafer; and an elastic wafer-retaining cushion sheet attached to a top of each of said wafer trays to place said semiconductor wafer thereon;

wherein said semiconductor wafer placed on a surface of said wafer-retaining cushion sheet is accommodated in an interior space formed between each of said wafer trays and another of said wafer trays that is adjacently superimposed thereover;

said wafer container further comprising:

a wafer suction-adhering surface formed on the surface of said wafer-retaining cushion sheet, said wafer suction-adhering surface adhering by suction to said semiconductor wafer;

said wafer trays each being provided with a plurality of bottom openings opening to a reverse side of said wafer-retaining cushion sheet, an air chamber communicating with said bottom openings, and a suction port for externally sucking out air from said air chamber;

wherein when the air in said air chamber is externally sucked out through said suction port to reduce air pressure in said air chamber, said wafer-retaining cushion sheet is elastically deformed in a state of being sucked toward said bottom openings at regions thereof facing said bottom openings, thus causing separation between said semiconductor wafer and at least a part of the wafer suction-adhering surface of said wafer-retaining cushion sheet.

18. The cushioned wafer container of claim 17, wherein said wafer suction-adhering surface is formed only at positions of said wafer-retaining cushion sheet that are coincident with said bottom openings formed in each of said wafer trays.

* * * * *